United States Patent [19]

Matsudaira et al.

[11] Patent Number: 4,920,919

[45] Date of Patent: May 1, 1990

[54] METHOD AND DEVICE FOR DEPOSITING A LUBRICANT LAYER TO MANUFACTURE A MAGNETIC RECORDING MEDIUM

[75] Inventors: Takeo Matsudaira; Hisanori Suzuki, both of Tokyo, Japan

[73] Assignee: Hoya Corporation, Tokyo, Japan

[21] Appl. No.: 402,364

[22] Filed: Sep. 5, 1989

Related U.S. Application Data

[62] Division of Ser. No. 162,023, Feb. 29, 1988, Pat. No. 4,882,197.

[30] Foreign Application Priority Data

Feb. 27, 1987 [JP] Japan .................................. 62-45471

[51] Int. Cl.[5] ............................................ C23C 14/24
[52] U.S. Cl. .................................... 118/725; 118/715; 118/726
[58] Field of Search ........................ 118/715, 725, 726

[56] References Cited

U.S. PATENT DOCUMENTS

| | | | |
|---|---|---|---|
| 3,466,156 | 9/1969 | Peters | 29/195 |
| 3,619,283 | 11/1971 | Carpenter | 118/726 |
| 3,634,040 | 1/1972 | Johnson | 118/726 |
| 3,719,525 | 3/1973 | Patel | 148/246 |
| 4,069,360 | 1/1978 | Yanagisawa | 428/64 |
| 4,171,388 | 10/1979 | Allen | 427/129 |
| 4,390,601 | 6/1983 | Ono | 427/255.6 |

Primary Examiner—Richard Bueker
Attorney, Agent, or Firm—Ladas & Parry

[57] ABSTRACT

In depositing a lubricant layer on a protection layer of a magnetic base, a lubricant is vaporized in a hollow space which is kept at a predetermined temperature under ambient pressure. The predetermined temperature is between 100° C. and 300° C. in consideration of the material of the protection layer and the vapor pressure of the lubricant. Preferably, the vaporization of the lubricant is carried out in a thermostatic chamber which defines a hollow space divided by a mesh partition into upper and lower chambers. The magnetic base and the lubricant are placed in the upper chamber with the lubricant held in a boat while a heater is disposed in the lower chamber.

4 Claims, 2 Drawing Sheets

METHOD AND DEVICE FOR DEPOSITING A LUBRICANT LAYER TO MANUFACTURE A MAGNETIC RECORDING MEDIUM

This is a Divisional on application Ser. No. 162,023 filed 2/29/88, now U.S. Pat. No. 4,882,197.

BACKGROUND OF THE INVENTION

This invention relates to a method and a device for manufacturing a magnetic recording medium and, in particular, to a method and a device for use in depositing a lubricant layer on a magnetic base having a protection layer formed prior to deposition of the lubricant layer.

Recent developments in electronic computers has produced requirements for magnetic recording media of large memory capacity, namely, a high packing density. In order to cope with and respond to such a requirement, various improvements have been introduced regarding the magnetic recording medium itself and the magnetic head driven in relation to the magnetic recording medium. At any rate, a floating head is very often used for increasing the packing density. Such a floating head is made to float over the magnetic recording medium, with a gap left between the head and the magnetic recording medium, by an air pressure resulting from rotation of the magnetic recording medium.

As known in the art, a floating head of a contact start stop type (will be abbreviated to a CSS type head hereinafter) is very effective to reduce or narrow the gap between the CSS type head and the magnetic recording medium. Practically, the gap may be equal to or less than 0.2 micron meter in the CSS type head. This shows that the CSS type head is available for a magnetic recording medium of a high packing density.

Herein, it is to be noted that the magnetic recording medium for the CSS type head has not only a recording zone but also a landing zone. The CSS type head is kept in contact with the landing zone before operation thereof and is detached from or lifted off the landing zone to float over the recording zone each time when the CSS type head is driven for write-in or readout operation of information. Thereafter, the CSS type head is landed on the landing zone again to be brought into contact therewith after the operation.

A magnetic recording medium for such a CSS type head usually comprises a substrate of a nonmagnetic material, such as aluminum, a magnetic layer of, for example, an alloy of Co-Ni, which is deposited on the substrate by vacuum evaporation or the like, and a protection layer of, for example, carbon, on the magnetic layer. Such a combination of the nonmagnetic substrate, the magnetic layer, and the protection layer will be collectively called a magnetic base hereinafter. Moreover, a lubricant layer is also coated on the protection layer so as to avoid damage or flaws which might otherwise occur on the magnetic recording medium due to friction or impact of the CSS type head upon liftoff or landing of the CSS type head. Therefore, the lubricant layer is indispensable to the magnetic recording layer for the CSS type head.

In Japanese Unexamined Patent Publication No. Syo 61-133,029, namely, 133,029/1986, description is made about a method of depositing such a lubricant layer on a protection layer. According to this method, a lubricant of a liquid is deposited on the protection layer by spin coating after it is dripped on the protection layer which is formed on a magnetic layer in a vacuum atmosphere. With this method, the lubricant must be diluted by the use of a solvent. Since the solvent is usually vapored or evaporated at an uneven rate during the drying process of the lubricant, a thickness of the lubricant layer is varied not only at various portions of each magnetic recording medium but also among a plurality of the magnetic recording media.

Alternatively, another method of depositing a lubricant layer is proposed in Japanese Unexamined Patent Publication No. Syo 61-214,132, namely, 214,132/1986 and comprises the steps of successively forming a magnetic layer and a protection layer on a nonmagnetic sheet and subsequently heating the nonmagnetic sheet to a temperature not lower than 50° C. Specifically, a combination of the nonmagnetic sheet, the magnetic layer, and the protection layer may be called a magnetic base as mentioned before and is fed from a roll to a drum which is heated at the above-mentioned temperature. Thereafter, the magnetic base is rolled up on another roll. A lubricant layer is deposited on the protection layer by vapor deposition during passage of the nonmagnetic sheet. With this method, it is very difficult to keep the protection layer at a constant temperature during deposition of the lubricant layer because the nonmagnetic sheet is locally heated only when the nonmagnetic sheet is brought into contact with the drum. As a result, the lubricant layer inevitably becomes uneven in thickness.

In any event, the lubricant layer may undulate at the landing zone of the magnetic recording medium due to an uneven thickness of the lubricant layer. Such undulation may give rise to a recessed portion and a ridge portion on the landing zone. Under the circumstances, a contact surface of the CSS type head may be embedded or fall in the recessed portion when the CSS type head is put on the landing zone. The CSS type head can not be readily detached or lifted off from the recessed portion once it falls in the recessed portion on rotation of the magnetic recording medium. This might bring about difficulties of rotation of the magnetic recording medium and liftoff of the CSS type head. It is to be noted that no consideration is made about an atmospheric temperature in the above-referenced Japanese Publication.

SUMMARY OF THE INVENTION

It is an object of this invention to provide apparatus for depositing, on a magnetic base, an even lubricant layer having a uniform thickness.

It is another object of this invention to provide apparatus of the type described, which is suitable for manufacturing a magnetic recording medium for a CSS type head.

It is still another object of this invention to provide apparatus of the type described, wherein it is possible to avoid difficulties of rotation of the magnetic recording medium and to facilitate liftoff of the CSS type head.

According to this invention, there is provided a device for use in depositing a lubricant layer on a protection layer formed on a magnetic base to fabricate a magnetic recording medium. The device comprises a chamber defining a hollow space therein, a mesh partition substantially horizontally disposed in the hollow space to divide the hollow space into a lower chamber and an upper chamber, a boat placed on the mesh partition in the upper room to store said lubricant, a holding member for holding the magnetic base which can be substantially vertically held relative to the mesh partition, a frame member for supporting the holding member over the boat in the upper chamber, and temperature controlling means for controlling the temperature of the hollow space.

DESCRIPTION OF THE PREFERRED EMBODIMENT

Figure 1:
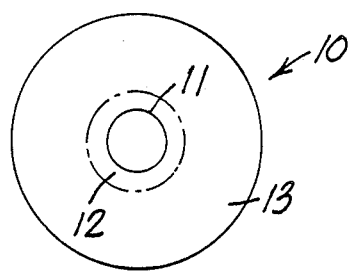
FIG. 1 is a plan view of a magnetic recording medium manufactured by this invention.

Referring to FIG. 1, description will be at first made for a better understanding of this invention as regards a magnetic recording medium 10 which can be manufactured by this invention and which can cooperate with a CSS type head (not shown). In the example being illustrated in FIG. 1, the magnetic recording medium 10 may be used as a magnetic disk and has a diameter of 130 millimeters and an inside aperture 11 of 40 millimeters in diameter. As shown at a broken line, the illustrated magnetic recording medium 10 has a landing zone 12 around the inside aperture 11 and a recording zone 13 outside of the landing zone. The CSS type head rests on the landing zone in an inactive state and floats over the recording zone in an active state.

Figure 2:
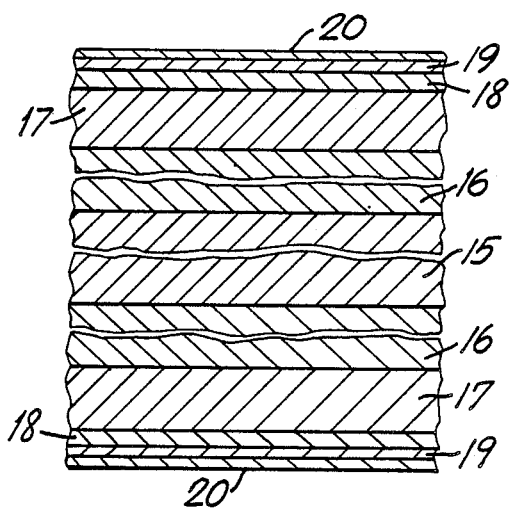
FIG. 2 is an enlarged partial sectional view of the magnetic recording medium illustrated in FIG. 1.

Referring to FIG. 2 together with FIG. 1, the magnetic recording medium 10 comprises a nonmagnetic substrate 15 of, for example, aluminum which has a thickness of 1.9 millimeters and first and second principal surfaces directed upwards and downwards of FIG. 2, respectively. First and second layer blocks are deposited on both the first and the second principal surfaces and are identical with each other. Therefore, description will be made only about the first layer block.

The first layer block comprises a plating layer 16 of, for example, nickel-phosphor which is 10 micrometers thick and which is laid on the first principal surface of the nonmagnetic substrate 15. On the plating layer 16, an underlying or ground layer 17 of Cr and a ferromagnetic layer 18 of, for example, an alloy of Co-Ni-Cr are successively deposited by magnetron sputtering. The ground layer 17 and the ferromagnetic layer 18 have thickness of 2000 angstroms and 700 angstroms, respectively. A protection layer 19 of carbon is deposited to a thickness of 400 angstroms on the ferromagnetic layer 18. Such a combination of the nonmagnetic substrate 15, the plating layer 16, the ground layer 17, the ferromagnetic layer 18, and the protection layer 19 may be referred to as a magnetic base for convenience of description. Finally, a lubricant layer 20 is deposited on the protection layer 19 in a manner to be described later in detail to finally form the magnetic recording medium 10 as shown in FIG. 1.

Figure 3:
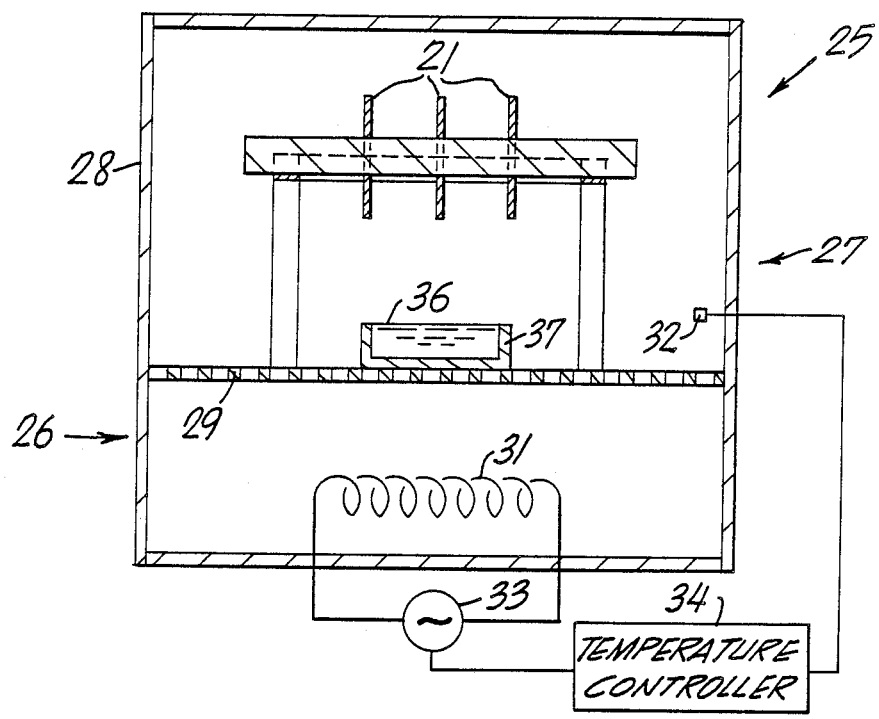
FIG. 3 is a sectional view of a lubricant deposition device according to a preferred embodiment of this invention.
Figure 4:
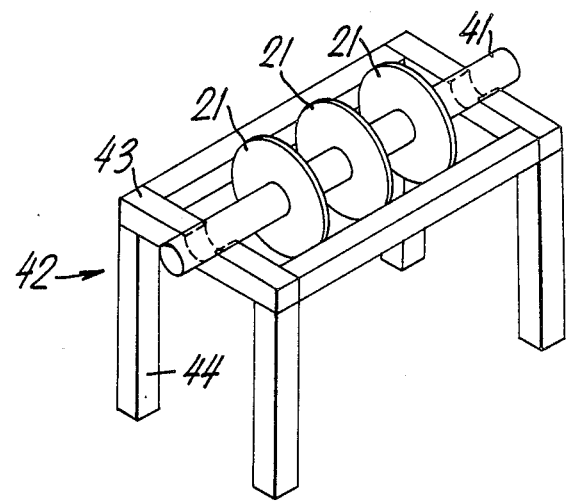
FIG. 4 is a perspective view for use in describing a part of the lubricant deposition device illustrated in FIG. 3 in detail.

Referring to FIGS. 3 and 4, a lubricant deposition device according to a preferred embodiment of this invention is for use in depositing a lubricant layer 20 on a magnetic base which is depicted at 21 in FIGS. 3 and 4 and which has a protection layer 19 as a surface layer, as readily understood from FIG. 2. In FIG. 3, the device comprises a chamber 25 which defines a hollow space therein and which may be preferably a thermostatic chamber as known in the art. The illustrated thermostatic chamber 25 has bottom and top boards placed at the top and the bottom of FIG. 3, a front board 26 on the left side of FIG. 3, a back board 27 on the right side of FIG. 3, and a pair of side boards (not shown). A door 28 is hinged on the front board 26 to open and close the thermostatic chamber 25. The device serves to uniformly deposit the lubricant layer 20 on the magnetic base by keeping a temperature of the hollow space, namely, an atomspheric temperature.

In the hollow space of the thermostatic chamber 25, a mesh partition 29 is substantially horizontally disposed to divide the hollow space into a lower chamber and an upper room. A heater 31 and a temperature sensor 32 are disposed in the lower and the upper chamber, respectively. The heater 31 is connected to a controllable a.c. power source 33 which is located outside of the thermostatic chamber 25. A temperature controller 34 is connected to both the temperature sensor 32 and the a.c. power source 33. From this structure, it is readily understood that the atmospheric temperature of the hollow space is sensed by the temperature sensor 32 and is adjusted to a predetermined temperature by controlling the heater 31 through the a.c. power source 33 by the temperature controller 34 in response to the sensed temperature.

In other words, the atmospheric temperature can be kept substantially constant within the chamber illustrated in FIG. 3. Accordingly, deposition of a lubricant layer can be carried out within a stable atmosphere. Such a stable atmosphere enables uniform deposition of the lubricant layer.

In FIG. 3, a lubricant 36 in a liquid state is stored or held in a bowl-shaped vessel or boat 37 and is placed in the upper chamber on the mesh partition 29. The lubricant 36 may be an undiluted or raw liquid. The boat 37 can be introduced into the hollow space through the door 28 attached to the front wall 26.

Referring to FIG. 4 together with FIG. 3, a cylindrical holder 41 serves as a holding member for holding the magnetic bases 21. The cylindrical holder 41 has a predetermined length and two ends and is extended through each inside aperture of three magnetic bases 21. As a result, the magnetic bases 21 are axially held by the cylindrical holder 41 with a spacing left between two adjacent ones of the magnetic bases 21. The cylindrical holder 41 is supported in the vicinity of the ends thereof by a frame member collectively depicted at 42. The frame member 42 comprises a rectangular frame 43 and four legs 44 attached to four corners of the rectangular frame 43. The rectangular frame 43 has a pair of short side bars and a pair of long side bars connected to the short side bars. On the short side bars, a semi-circular recessed portions are formed to stably support the cylindrical holder 41 together with the magnetic bases 21. Thus, the cylindrical holder 41 rests on the frame member 42 without any rotation thereof.

For deposition of the lubricant layer, the frame member 42 is introduced into the upper room of the thermostatic chamber 25 with the magnetic bases 21 supported on the cylindrical holder 41. The boat 37 is also introduced into the upper chamber with the lubricant 36 held in the boat 37. It is assumed that the lubricant 36 is an undiluted liquid of a fluorocarbon group and may be FOMBLIN Z-DOL2000 which is manufactured and sold by Montefluos S.p.A. and which has a vapor pressure of $1.8\times10^{-5}$ Torr at a room temperature. After the boat 37 and the frame member 42 with the magnetic bases 21 are put in place on the mesh partition 29, as shown in FIG. 3 through the open door 28, the door 28 is closed to seal the thermostatic chamber 25. It is to be noted here that the hollow space of the thermostatic chamber 25 is not exhausted and is therefore kept at ambient pressure.

Next, the atmospheric temperature of the hollow space is set at the predetermined temperature of, for example, 150° C. by the temperature controller 34 interposed between the temperature sensor 32 and the a.c. power source 33. Under the circumstances, the a.c. power source 33 is turned on to drive the heater 31. As a result, the temperature of the hollow space is elevated by the heater 31 at a temperature elevation rate of about 20° C./minute from the room temperature to 150° C. and is kept at a temperature range between 150° C.+2° C. and 150° C.−2° C. for one hour which will be called a deposition time or a holding time. Thereafter, the door 28 is opened and the frame member 42 is taken out of the hollow space.

While the temperature is kept at the above-mentioned temperature range, the lubricant 36 is heated and vaporized by the above-mentioned temperature. Simultaneously, the protection layer 19 is also heated within the hollow space. From this fact, it is readily understood that the temperature of the protection layer is also kept substantially invariable. Therefore, the lubricant layer 20 is formed during deposition under an invariable condition. This shows that the lubricant layer 20 is uniformly deposited on the protection layer 19. Thus, magnetic recording medium 10 is manufactured by depositing the lubricant layer 20.

In the illustrated example, it has been found that the lubricant layer 20 falls within a thickness range between (30+5) angstroms and (30−5) angstroms and exhibits an excellent flatness in comparison with that deposited by the conventional methods.

Thus, the chamber temperature is kept within a predetermined temperature range and the undiluted liquid is vaporized at a constant rate within such predetermined temperature range. In addition, the temperature of the protection layer 19 is also kept substantially invariable. Therefore, the lubricant layer 20 is substantially uniformly deposited on the protection layer 19 of each magnetic base 21 even when the lubricant 36 is diluted by a solvent. As a result, it is possible to prevent the lubricant layer 20 from undesirably undulating at the landing zone 12 (FIG. 1). This means that a magnetic head is smoothly taken off from the landing zone 12 at the start of rotation of the magnetic recording medium manufactured in the manner illustrated above.

Moreover, it is possible to avoid variations of thicknesses of the lubricant layers 20 among a plurality of the magnetic bases 21 when the temperature and the deposition time are not changed at every deposition process of the lubricant layers 20.

Let such a lubricant 36 be unevenly vaporized in the hollow space during the deposition and be unevenly deposited on the protection layer 19 with a locally thick portion formed on the protection layer 19 once. However, an extra amount of the lubricant may be vapored from the locally thick portion again during the deposition or heat treatment to form a uniform lubricant layer.

This phenomenon will be explained in the following. Adhesion or bonding strength between the protection layer 19 and the lubricant deposited on the protection layer 19 is stronger than an internal binding strength of the lubricant itself and serves to determine a predetermined thickness of the lubricant layer. In other words, the lubricant can be strongly bonded to the protection layer 19 within the predetermined thickness. In addition, the predetermined thickness is also dependent on the temperature of the protection layer 19. Under the circumstances, it may be difficult to deposit the lubricant layer to a thickness which exceeds the predetermined thickness. Consequently, the lubricant is evaporated at a portion exceeding the predetermined thickness to leave the lubricant layer of the predetermined thickness on the protection layer.

As shown in FIG. 3, the magnetic bases 21 are substantially vertically disposed in the hollow space relative to the mesh partition 29 which is placed horizontally. Accordingly, the lubricant layers 20 can be simultaneously deposited on both the layer blocks formed on both the principal surfaces of the nonmagnetic substrate 15 (FIG. 2). This enables a reduction of manufacturing costs of the magnetic recording media.

With the method, the lubricant layers can be deposited at the ambient pressure. In other words, the method dispenses with any vacuum system, such as a vacuum pump, and is therefore economical in comparison with the conventional method which needs such a vacuum system. In the example being illustrated, the magnetic bases and the lubricant can be heated by the use of a single heater 31. Therefore, the illustrated device is simple in structure.

While this invention has thus far been described in conjunction with a preferred embodiment thereof, it will readily be possible for those skilled in the art to put this invention into practice in various other manners. For example, the lubricant may be one of fluorinated oils, such as Krytox sold by E.I. DuPont De Nemours & Company (INC.), Fluorad sold by Minnesota Mining and Manufacturing Company, Demnum sold by Daikin Industries, Ltd. Furthermore, fatty acid and silicone oils may be used as the lubricant when they have a high thermal stability and a good lubrication. Such fatty acid may be either or palmitic acid and/or oleic acid. At any rate, it is preferable that the lubricant has a vapor pressure between $10^{-9}$ and $10^{-2}$ Torr at the room temperature.

More specifically, when a lubricant has a vapor pressure higher than $10^{-2}$ Torr, a lubricant layer produced from such lubricant is so low in viscosity that the lubricant layer tends to be changed in thickness during the rotation of a magnetic recording medium having the lubricant layer because the lubricant layer may move towards a circumferency thereof and may be unevenly evaporated. On the other hand, a deposition time for the lubricant becomes too long when the vapor pressure of the lubricant is lower than $10^{-9}$ Torr. This results in a reduction of workability.

An additional heater may be immersed into the lubricant 36 so as to directly evaporate the lubricant together with the heater 31 disposed in the lower chamber of the chamber 25. Such an additional heater is effective to shorten the deposition time even when the lubricant has a vapor pressure equal to or lower than $10^{-6}$ Torr at the room temperature.

The temperature elevation rate and the deposition time of the predetermined temperature may be decided in consideration of each material of the lubricant and the protection layer. The predetermined temperature is not restricted to 150° C. and may preferably fall within a temperature range between 100° C. and 300° C. If the predetermined temperature is selected at a temperature lower than 100° C., it becomes difficult to thermally desorb moisture and organic molecules absorbed in the protection layer. The resultant lubricant layer is weak in adhesion in dependency upon a material of the lubricant. If the predetermined temperature exceeds 300° C., a magnetic characteristic is deteriorated and thermodecomposition and oxidation may take place in the lubricant layer in dependency upon a material of the lubricant.

The atmospheric temperature may be varied within a range between +10° C. and −10° C., although such a range has been between +2° C. and −2° C. in the example illustrated in FIG. 3.

The method of depositing the lubricant layer may be modified by preliminarily heating the hollow space to the predetermined temperature and by thereafter introducing the magnetic bases into the hollow space preliminarily heated. In addition, the lubricant layer may be deposited in a vacuum atmosphere.

The nonmagnetic substrate 15 may be of one of glass, ceramics, and organic resins having a high thermal stability. The protection layer 18 may be one of a $SiO_2$ layer, a $Si_3N_4$ layer, and a double layer of a Cr layer and a C layer. The ground layer 17 may be removed from the magnetic recording medium.

What is claimed is:

1. Apparatus for depositing a lubricant layer on a protection layer formed on a magnetic base to fabricate a magnetic recording medium, said apparatus comprising:

a chamber defining a hollow space therein;

a mesh partition substantially horizontally disposed in said hollow space to divide said hollow space into upper and lower chambers;

a vessel on said mesh partition in said upper chamber to store said lubricant;

holding means for holding a magnetic base substantially vertically relative to said mesh partition;

a frame member supporting said holding means over said vessel in said upper chamber; and temperature controlling means for controling the temperature in said upper chamber outside said vessel, said temperature controlling means comprising;

a temperature sensor located outside said vessel within said hollow space for sensing the temperature in said hollow space;

a heater located in said lower chamber for electrically heating said hollow space; and a temperature controller connected to said temperature sensor and to said heater for controlling said heater in response to the temperature in said hollow space to keep said temperature substantially constant.

2. Apparatus as claimed in claim 1 wherein said sensor is disposed in said upper chamber.

3. Apparatus as claimed in claim 1 wherein said holding means holds a plurality of magnetic bases in parallel spaced relations.

4. Apparatus as claimed in claim 1 wherein said hollow space is maintained at ambient pressure during heating.

* * * * *

UNITED STATES PATENT AND TRADEMARK OFFICE
CERTIFICATE OF CORRECTION

PATENT NO. : 4,920,919
DATED : May 1, 1990
INVENTOR(S) : Takeo MATSUDAIRA and Hisanori SUZUKI It is certified that error appears in the above-identified patent and that said Letters Patent is hereby corrected as shown below:

On the title page:

Foreign priority - Item 30 - should be
February 28, 1987 instead of February 27, 1987

Signed and Sealed this

Eighth Day of June, 1993

Attest:

MICHAEL K. KIRK

Attesting Officer

Acting Commissioner of Patents and Trademarks